United States Patent [19]
Sakurada et al.

[11] Patent Number: 5,948,163
[45] Date of Patent: Sep. 7, 1999

[54] APPARATUS FOR MANUFACTURING CRYSTALS ACCORDING TO THE CZOCHRALSKI METHOD, AND CRYSTALS MANUFACTURED BY THE MANUFACTURING METHOD

[75] Inventors: Masahiro Sakurada, Koriyama; Tomohiko Ohta, Nishishirakawa, both of Japan

[73] Assignee: Shin-Etsu Handotai Co., Ltd., Tokyo, Japan

[21] Appl. No.: 08/798,472

[22] Filed: Feb. 10, 1997

[30] Foreign Application Priority Data

Feb. 14, 1996 [JP] Japan ................................ 8-050897

[51] Int. Cl.⁶ ............................................... C30B 35/00
[52] U.S. Cl. ............................................ 117/208; 117/200
[58] Field of Search .................................. 117/13, 14, 15, 117/201, 202, 208, 200

[56] References Cited

U.S. PATENT DOCUMENTS

| | | | |
|---|---|---|---|
| 4,738,832 | 4/1988 | Drechsel | 117/217 |
| 5,363,796 | 11/1994 | Kobayashi et al. | 117/30 |
| 5,373,808 | 12/1994 | Sassa et al. | 117/208 |
| 5,698,029 | 12/1997 | Fujikawa et al. | 117/200 |
| 5,707,447 | 1/1998 | Schulmann et al. | 117/217 |

FOREIGN PATENT DOCUMENTS

| | | |
|---|---|---|
| 0140509 | 5/1985 | European Pat. Off. |
| 0595269 | 5/1994 | European Pat. Off. |
| 4204777 | 10/1992 | Germany |
| 2-267195 | 10/1990 | Japan |
| 3-177394 | 8/1991 | Japan |
| 6-300479 | 10/1994 | Japan |
| 7-69778 | 3/1995 | Japan |
| 2139918 | 11/1984 | United Kingdom |
| 2218789 | 11/1989 | United Kingdom |

OTHER PUBLICATIONS

H. Yamagishi et al, "Evaluation of FPDS and Cops in Silicon Single–Crystals", Proceedings of the 17th International Symposium on Silicon Materials Science and Technology, Semiconductor Silicon, 1994, pp. 124–135.

N. Fujimaki et al., "Influence of Micro Crystal Defect in Silicon Single Crystal on Gate Oxide Integrity", UCS Semiconductor Substrate Technology Workshop, Ultraclean Technology, vol. 7, Issue 3, pp. 26–33.

F. Shimura, "Semiconductor Silicon Crystal Technology", pp. 178–181, 1989.

*Primary Examiner*—Felisa Hiteshew
*Attorney, Agent, or Firm*—Oliff & Berridge, PLC

[57] ABSTRACT

A crystal manufacturing apparatus includes a crucible for containing a material, a heater for heating and melting the material, and a heat insulating cylinder arranged so as to surround the crucible and the heater. The crystal manufacturing apparatus is operated in accordance with the Czochralski method. The heat insulating cylinder is arranged to be vertically movable. When two or more crystals are pulled within a single batch, the vertical position of the heat insulating cylinder is changed between the manufacture of the crystals, so that the thermal histories of the crystals are made different from one another. Moreover, when a crystal is pulled in accordance with the Czochralski method, the heat insulating cylinder is moved vertically while the crystal is being pulled.

20 Claims, 4 Drawing Sheets

APPARATUS FOR MANUFACTURING CRYSTALS ACCORDING TO THE CZOCHRALSKI METHOD, AND CRYSTALS MANUFACTURED BY THE MANUFACTURING METHOD

BACKGROUND OF THE INVENTION

1. Field of the Invention

The present invention relates to a crystal manufacturing apparatus and a crystal manufacturing method in which crystals are grown according to the Czochralski (CZ) method.

2. Description of the Related Art

With recent increases in the degree of integration and precision in semiconductor devices, quality requirements for semiconductor crystal substrates have shown a tendency to become stricter. Semiconductor crystals are primarily grown by the CZ method, and every effort has been made to grow crystals having higher purity, lower defect density, and higher homogeneity. Recently, it has been found that a crystal defect is closely related not only to purity of a raw material, purity of a member used, and accuracy of an apparatus, but also to the thermal history of a crystal during its growth. For example, for silicon, a thermal history has an effect on OSF (Oxidation Induced Stacking Faults), oxygen precipitation, BMD (Bulk Micro-Defect), FPD (Flow Pattern Defect), LSTD (Laser Scattering Tomography Defect), and the oxide dielectric breakdown voltage. Also, for compound semiconductors such as GaP, GaAs, and InP, a thermal history has a considerable effect on dislocation density and a level of such defects as functioning as a donor or an acceptor. Accordingly, there have been proposed crystal manufacturing apparatuses having a variety of furnace structures that control defects in crystals through adjustment of a thermal history during crystal growth (refer to, for example, H. Yamagishi, I. Fusegawa, K. Takano, E. Iino, N. Fujimaki, T. Ohta, and M. Sakurada, Proceedings of the 17th International Symposium on Silicon Materials Science and Technology, SEMICONDUCTOR SILICON 1994, PP.124–135).

However, according to these proposed apparatuses or methods, only the temperature at a certain position within a furnace can be increased or decreased, i.e. the entire temperature distribution within a furnace cannot be adjusted. Further, this control of temperature at a certain position within the furnace is such that the temperature of an entire grown crystal is increased or decreased. That is, this temperature control has no degrees of freedom, and its accuracy is poor. Also, when a temperature distribution needs to be changed to meet a new design requirement, an apparatus must be redesigned from the beginning.

That is, in conventional crystal manufacturing apparatuses or crystal manufacturing methods, the range of control of a temperature distribution within a furnace is very narrow and thus the range of control of the thermal history of a crystal is also very narrow, and in addition the accuracy of the control is very low. Within a single apparatus or furnace structure, it is impossible to change or control a temperature distribution within a furnace and thus to change or control the thermal history of a crystal during growth of a crystal or between crystals. Accordingly, when the thermal history of a crystal must be changed in accordance with a required crystal quality or a standard, an apparatus itself must be changed. In other words, an apparatus must be selected according to a crystal to be grown. This situation narrows the attainable range of quality for crystals and brings about a significant increase in apparatus cost.

SUMMARY OF THE INVENTION

The present invention has been accomplished to solve the above-described problems, and an object of the present invention is to provide a crystal manufacturing apparatus and a crystal manufacturing method capable of readily, accurately, and freely controlling the thermal history of a crystal being grown by the Czochralski method through adjustment of a temperature distribution within a furnace.

Another object of the present invention is to provide a crystal manufacturing apparatus and a crystal manufacturing method capable of freely changing or controlling a temperature distribution within a furnace so as to change or control the thermal history of a crystal during crystal growth or between crystals even when such crystal growth is performed in a single apparatus.

Still another object of the present invention is to provide crystals manufactured by the method according to the present invention.

To achieve the above objects, the present invention provides a crystal manufacturing apparatus which includes a crucible for containing a material, a heater for heating and melting the material, and a heat insulating cylinder arranged so as to surround the crucible and the heater and which employs the Czochralski method, wherein the insulating cylinder is arranged to be vertically movable.

Since the heat insulating cylinder is arranged to be vertically movable, its vertical position can be changed during crystal growth or between crystals to thereby change a temperature distribution within the furnace so as to change or control a thermal history during crystal growth.

Preferably, the heat insulating cylinder is vertically divisible.

This structure increases degrees of freedom in changing the temperature distribution within the furnace, resulting in an increased range of control of the thermal history of a crystal and an improved accuracy of control as compared with a single undivided insulating cylinder.

Preferably, at least one of the vertical divisions of the heat insulating cylinder is vertically movable.

This structure permits not only the heat insulating cylinder as a whole but also at least one of the vertical divisions of the heat insulating cylinder to move vertically. Thus, a variety of temperature distributions can be established within the furnace so as to meet a variety of requirements.

Preferably, at least two of the vertical divisions of the heat insulating cylinder are vertically movable in a manner independent of each other.

This structure drastically improves degrees of freedom to thereby more freely control a temperature distribution within the furnace so as to more freely control the thermal history of a crystal as compared with a case where only a single heat insulating cylinder is disposed in a vertically movable manner or a vertical divided heat insulating cylinder is disposed such that the divided portions cannot be moved independently of each other.

When the heat insulating cylinder is divisible, the divisions are preferably Joined with each other through fitting engagement.

This type of engagement permits the heat insulating cylinder to freely change its length or position in a vertical direction, so that heat insulation for a crystal can be freely adjusted.

Preferably, when a support shaft for supporting and vertically moving a vertical division of the heat insulating cylinder is inserted from under the chamber, the support shaft is inserted through a hole formed in a stationary vertical division of the heat insulating cylinder.

When a support shaft for supporting and vertically moving a vertical division of the heat insulating cylinder is inserted from under the chamber, it is necessary to protect the support shaft from exposure to high-temperature heat radiated from the heater and to prevent the size of the apparatus from increasing due to installation of a heat insulating cylinder elevation mechanism. Such problems can be solved and the apparatus can be maintained compact by the structure in which the support shaft is passed through a hole formed in the stationary vertical division of the heat insulating cylinder so as to support the movable vertical division.

Preferably, the vertical divisions of the heat insulating cylinder have different thicknesses.

This employment of different thicknesses for the vertical divisions of the heat insulating cylinder allows a user to more precisely control a temperature distribution within the furnace to thereby more precisely control the thermal history of a crystal.

Preferably, the vertical divisions of the heat insulating cylinder are made of different materials.

This use of different materials for the vertical divisions of the heat insulating cylinder allows a user to more precisely control a temperature distribution within the furnace to thereby more precisely control the thermal history of a crystal.

Preferably, the heat insulating cylinder is made of carbon fiber forms.

Since carbon fiber forms are generally used as material for heat insulating cylinders used in the Czochralski method, they are readily available. Also, they are easy to process.

The present invention provides the following methods which use the crystal manufacturing apparatus of the invention: a method of growing a crystal in accordance with the CZ method; a method of growing a crystal of silicon, germanium, GaP, GaAs, or InP in accordance with the CZ method; a method of controlling a temperature distribution within the crystal manufacturing apparatus that is operated in accordance with the CZ method; and a method of controlling the thermal history of a crystal to be grown in accordance with the CZ method.

The crystal manufacturing apparatus of the present invention allows a user to precisely control a temperature distribution within a furnace so as to control the thermal history of a crystal being grown. Thus, the generation of a crystal defect induced by a thermal history can be suppressed or controlled when a crystal is grown by the Czochralski method, particularly when a crystal of silicon, germanium, GaP, GaAs, or InP is grown by the Czochralski method.

The present invention provides a method of growing a crystal by the Czochralski method, wherein two or more crystals are pulled within a single batch such that a movable heat insulating cylinder is moved vertically between growth of the crystals so as to change the position of the heat insulating cylinder, so that the crystals have different thermal histories during growth.

This method permits a thermal history to be changed between crystals within a single batch in accordance with a required quality or a standard in contrast with a conventional method in which only crystals having a similar tendency of quality can be grown within a single batch. Also, in this method, crystals having a required quality can be grown in any required quantity.

The present invention provides a method of growing a crystal by the Czochralski method, wherein a crystal is pulled while a heat insulating cylinder is being moved vertically.

In contrast with a conventional method wherein a heat insulating cylinder is normally made stationary while a crystal is being pulled, the heat insulating cylinder of the present invention is vertically moved while a crystal is being pulled, to thereby attain the thermal history of a crystal which cannot be attained by a conventional method.

The present invention provides a method of growing a crystal by the Czochralski method, wherein at least one of the vertical divisions of a heat insulating cylinder is vertically moved while a crystal is being pulled.

This method enables more precise control of the thermal history of a crystal over a wider temperature range.

The present invention provides a method of growing a crystal by the Czochralski method, wherein the speed of vertically moving a heat insulating cylinder is linked with the pulling rate of a crystal.

This method allows the heat insulating cylinder to be moved precisely to a desired position as a crystal grows, so that the thermal history of a crystal can be extremely precisely controlled.

The present invention provides a method of growing a crystal of silicon, germanium, GaP, GaAs, or InP by the Czochralski method in accordance with the above-described method.

Since the thermal history of a crystal being grown can be precisely controlled, this method is particularly useful for growing crystals of silicon, germanium, GaP, GaAs, and InP of which the thermal history during growth has a great effect on the generation of crystal defects.

The present invention provides crystals of silicon, germanium, GaP, GaAs, and InP manufactured by the method of the invention.

Since the thermal history during growth is accurately controlled in the method of the invention, these crystals have considerably high quality and have controlled crystal defects and the like.

As described above, in the crystal manufacturing apparatus of the present invention, the heat insulating cylinder is arranged to be vertically movable. Thus, the vertical position of the heat insulating cylinder can be changed during crystal growth or between crystals to thereby change a temperature distribution within a furnace so as to control a thermal history of a crystal during growth.

Accordingly, there can be reduced or controlled a thermal-history-induced crystal defect which generates in crystals of silicon, germanium, GaP, GaAs, InP, and the like grown by the CZ method, with no requirement to drastically lower a crystal growth rate. Further, thus-grown crystals are homogeneous. The present invention, therefore, significantly improves crystal quality, yield, and productivity.

Since the present invention provides a crystal manufacturing apparatus and a crystal manufacturing method capable of freely changing or controlling a temperature distribution within a furnace, the thermal history of a crystal can be changed or controlled during crystal growth or between crystals even when such crystal growth is performed in a single apparatus. Accordingly, a factory running cost can be reduced.

Thus, the present invention is very useful industrially.

DESCRIPTION OF THE PREFERRED EMBODIMENTS

The inventors of the present invention paid attention to the structure of a heat insulating cylinder for use as means for changing or adjusting the thermal history of a crystal to be grown by the Czochralski method, which heat insulating cylinder surrounds, for a heat insulating purpose, a crucible for containing a material and a heater for heating and melting the material.

Figure 4A:
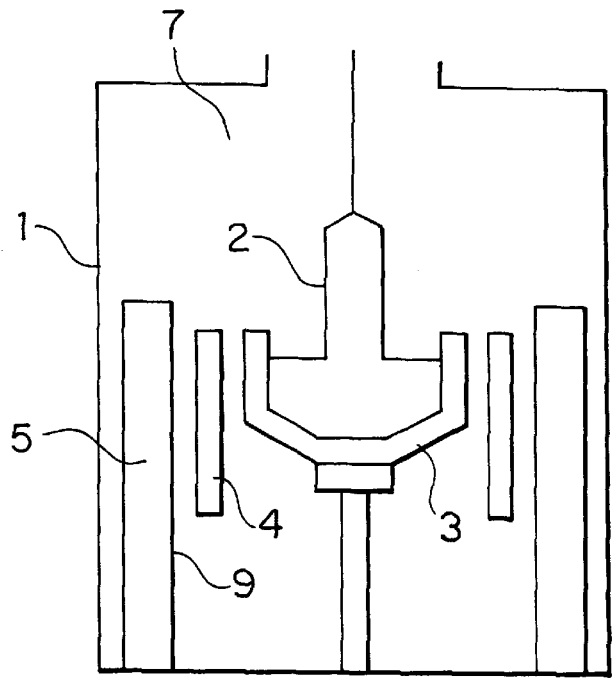
FIG. 4A is a schematic sectional view of a conventional fast cooling type crystal manufacturing apparatus.
Figure 4B:
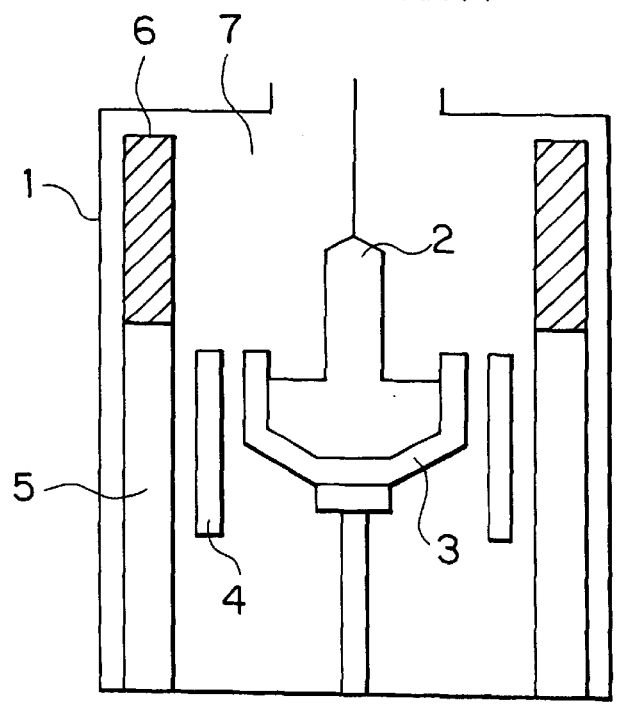
FIG. 4B is a schematic sectional view of a conventional slow cooling type crystal manufacturing apparatus.

FIGS. 4A and 4B exemplify a conventional crystal manufacturing apparatus for growing crystals by the CZ method. A heat insulating cylinder 5 is normally made of carbon fiber forms and is arranged so as to surround a crucible 3 for containing a material and a heater 4 for heating the crucible 3 to thereby melt the contained material.

Conventionally, in order to change a temperature distribution within a furnace or the thermal history of a crystal, the structure of a heat insulating cylinder is changed in the following manner. An upper heat insulating cylinder 6 is provided on the top of the heat insulating cylinder 5 to thereby expand the heat insulating cylinder 5 upward as shown in FIG. 4B. An upper space 7 within a crystal growth furnace is thus heat-insulated to thereby heat-insulate a crystal 2. In contrast, the heat insulating cylinder is shortened as shown in FIG. 4A to thereby quickly cool the crystal 2.

However, this method only provides a choice between the heat insulation of a crystal and the cooling of a crystal, and cannot perform control within a specific temperature range. This method also has a disadvantage of poor accuracy of control. For example, even when it is known that a certain temperature range has a strong effect on defects induced in a crystal during its growth, this method cannot specifically change or control this temperature range.

Particularly, for a single apparatus or batch, it is impossible for the conventional method to change or control a temperature distribution within a furnace and thus to change or control the thermal history of a crystal during crystal growth or between crystals. In order to change the thermal history of a crystal to be grown, it is necessary to change the apparatus itself or to change furnace members.

For example, when a crystal of silicon to be grown is required to have reduced FPD and reduced COP, it is known that the following control must be exercised. In order to suppress the density of FPD, it is necessary to increase the time of passage through a temperature range of 1080 to 1150° C. during crystal growth and to gradually cool the grown crystal (Fujimaki et al., "Effect of Micro-defect in a Single Crystal of Silicon on Oxide Film," UCS Semiconductor Substrate Technology Workshop, ULTRACLEAN TECHNOLOGY, Vol. 7, Issue 3, pp. 26). In order to decrease the density of COP, it is necessary to decrease the time of passage through a temperature range of 1000° C. or higher and to quickly cool the grown crystal (Japanese Patent Application No. 6-300479).

Accordingly, since FPD and COP show mutually conflicting behaviors, it is impossible for a conventional crystal manufacturing apparatus to grow a crystal having reduced FPD and reduced COP. In other words, a conventional crystal manufacturing apparatus can only grow a crystal having either reduced FPD or reduced COP. In order to pull a crystal having reduced FPD, a slow cooling type crystal manufacturing apparatus as shown in FIG. 4B is used, whereas in order to pull a crystal having reduced COP, a fast cooling type crystal manufacturing apparatus as shown in FIG. 4A is used.

Also, it is impossible for the above-described conventional method to change the thermal history between crystals which are pulled within a single batch according to the so-called multi-pulling method (Fumio Shimura, Semiconductor Silicon Crystal Technology, pp. 178 (1989)). In the multi-pulling method, a plurality of single crystals having, for example, a certain dopant density to meet a standard regarding the resistance range are pulled such that after a first crystal is pulled, material weighing the same as that of the first crystal is recharged into a crucible so that a second crystal can be pulled, followed by the same process until a required number of single crystals are pulled, thereby improving the yield of pulling and reducing cost of pulling. In such a conventional method, it is impossible to grow a first crystal having reduced FPD and a second crystal having reduced COP. Also, when a long crystal is grown in a single batch, it is impossible to make the first half of the crystal have reduced FPD and the last half have reduced COP.

As described above, a conventional method cannot grow a crystal which meets a plurality of quality requirements, and even has difficulty in growing a crystal which satisfactorily meets a single quality requirement, and particularly cannot change heating conditions as needed in order to give a different thermal history within a single batch.

In order to obtain a crystal having reduced FPD and reduced COP, it is known that a crystal growth rate must be drastically lowered (for example, not more than 0.4 mm/min) as described, for example, in Japanese Patent Application Laid-Open (kokai) No. 2-267195. However, this method causes productivity to be halved or worse with a resultant significant increase in cost of manufacture, and cannot control crystal defects other than FPD and COP.

If the thermal history of a crystal to be grown can be changed or controlled by freely controlling a targeted specific temperature range, particularly by changing a temperature distribution within a furnace during crystal growth when necessary, various good quality crystals having reduced crystal defects will be obtained with high speed and high productivity.

Next, a description will be given of embodiments of the present invention with reference to the drawings.

FIG. 1 schematically shows the structure of a crystal manufacturing apparatus according to an embodiment of the present invention.

In view of the fact that a heat insulating cylinder, which surrounds a heater 4 (for example, a carbon heater, an induction coil, etc.) and a crucible 3 (made for example of quartz, graphite, or PBN) to protect a water-cooled chamber 1, has a determinant effect on a temperature distribution within a furnace of the CZ method, the inventors have devised this heat insulating cylinder.

The inventors have computed crystal temperatures in crystal manufacturing apparatuses having a variety of intra-furnace structures. As a result, it has been found that in order to freely control a temperature distribution within a furnace to thereby freely change or control the thermal history of a crystal during crystal growth or between crystals, the heat insulating cylinder must be arranged to be vertically movable. Particularly, it has been found that in order to expand a controllable temperature range and to improve accuracy of control, the heat insulating cylinder is arranged to be vertically divisible and to make at least one of the vertical divisions of the heat insulating cylinder vertically movable.

Figure 1A:
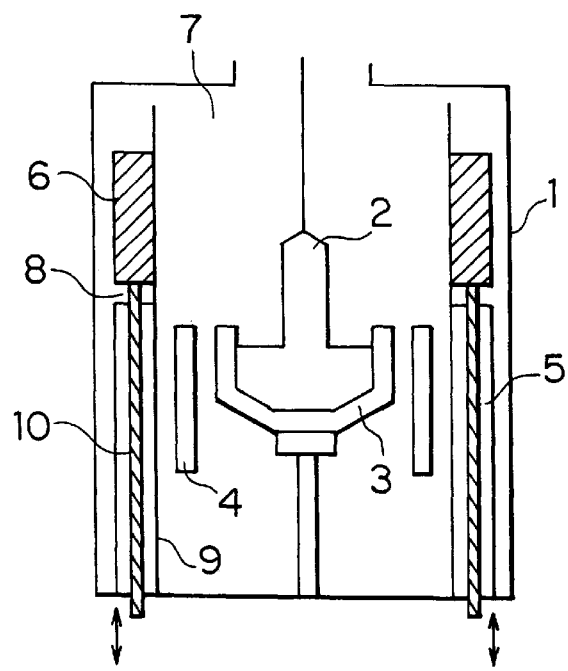
FIG. 1A is a schematic sectional view of a crystal manufacturing apparatus according to an embodiment of the present invention, showing a heat insulating cylinder which is divided into vertical divisions and whose upper division is vertically movable.
Figure 1B:
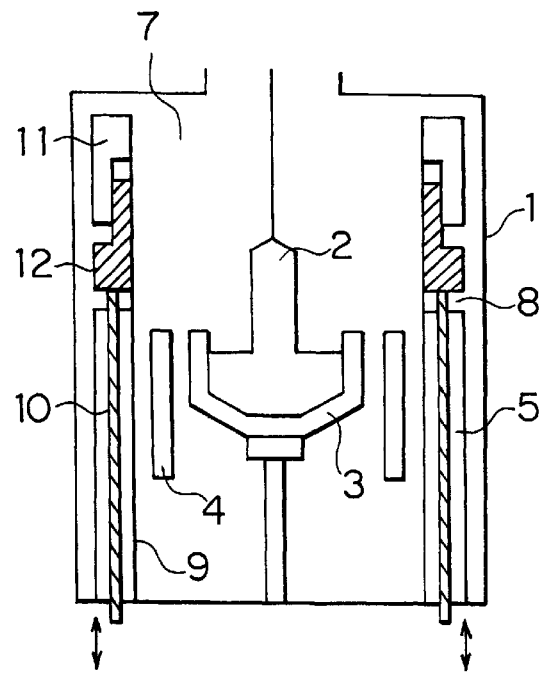
FIG. 1B is a schematic sectional view of a crystal manufacturing apparatus according to another embodiment of the present invention, showing a heat insulating cylinder which is divided into vertical divisions and whose intermediate division is vertically movable.
Figure 1C:
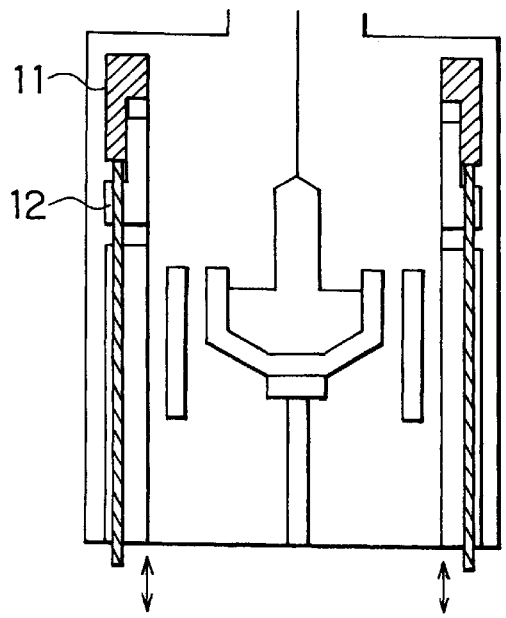
FIG. 1C is a schematic sectional view of a crystal manufacturing apparatus according to a further embodiment of the present invention, showing, a heat insulating cylinder which is divided into vertical divisions and whose top division is vertically movable.
Figure 1D:
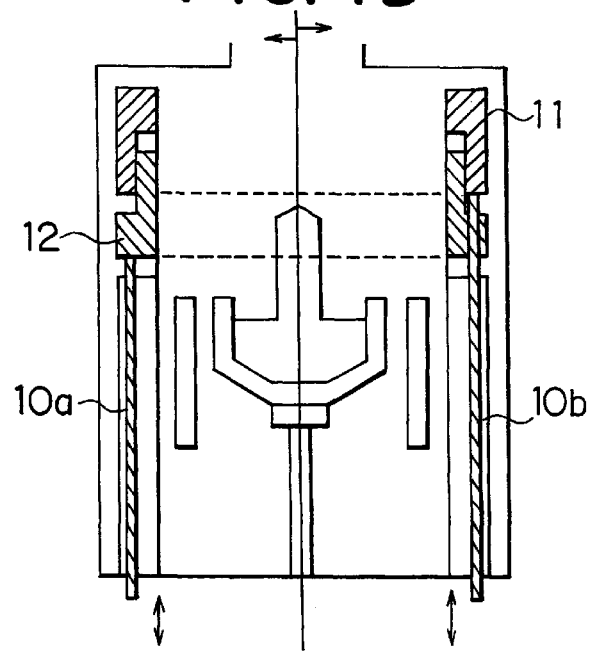
FIG. 1D is a schematic sectional view of a crystal manufacturing apparatus according to still another embodiment of the present invention, showing a heat insulating cylinder which is divided into vertical divisions and whose intermediate and top divisions are vertically movable in a manner independent of each other.

To attain this arrangement, the present invention may be embodied in various forms, for example, as shown in FIGS. 1A, 1B, 1C, and 1D. In FIG. 1A, the heat insulating cylinder is divided into upper and lower divisions, and the upper division is arranged to be vertically movable. In FIG. 1B, the upper division of the heat insulating cylinder is further divided into two divisions, and the lower division (intermediate heat insulating cylinder) of the two divisions is arranged to be vertically movable. In FIG. 1C, the upper division of the heat insulating cylinder is further divided into two divisions, and the upper division (top heat insulating cylinder) of the two divisions is arranged to be vertically movable. In FIG. 1D, the upper division of the heat insulating cylinder is further divided into two divisions, and the two divisions are arranged to be vertically movable in a manner independent of each other.

Here, the heat insulating cylinder of FIG. 1B will be described. A stationary heat insulating cylinder 5, which corresponds to a conventional counterpart, is fixedly arranged so as to surround a crucible 3 for containing a material and a heater 4 for heating and melting the material. A top heat insulating cylinder 11 and an intermediate heat insulating cylinder 12 are separably provided on the top of the heat insulating cylinder 5. Here, the intermediate heat insulating cylinder 12 is supported from underneath by support shafts 10 in a vertically movable manner.

In this case, the support shafts 10, which are used to move vertically the intermediate heat insulating cylinder 12, are inserted from under the chamber 1 through holes formed in the stationary heat insulating cylinder 5 to thereby support the intermediate heat insulating cylinder 12.

Because of this arrangement, the support shafts 10 are protected from direct exposure to high-temperature heat radiated from the heater 4 to thereby be prevented from deteriorating. This arrangement also avoids an increase of the size of the chamber 1 which would otherwise be caused by the support shafts 10 arranged outside the heat insulating cylinder 5 and increase of the size of the apparatus which would otherwise be caused by installation of a heat insulating cylinder elevation mechanism.

A heat insulating cylinder elevation mechanism is not limited to the above-described arrangement wherein support shafts are inserted from under a chamber to thereby support a vertically movable heat insulating cylinder. The vertically movable heat insulating cylinder may be supported from above, for example, from the upper portion of the chamber. Various other arrangements are also conceivable through use of known techniques.

In the present embodiment, the top heat insulating cylinder 11 and the intermediate heat insulating cylinder 12 are joined with each other through fitting engagement. In such fitting engagement of the vertical divisions of the heat insulating cylinder, the heat insulating cylinder 5, the intermediate heat insulating cylinder 12, and the top heat insulating cylinder 11 are continuously arranged in a vertical direction when the intermediate heat insulating cylinder 12 is lowered to the bottom position of its vertical stroke; on the other hand, a gap 8 is formed to release heat in a horizontal direction when the intermediate heat insulating cylinder 12 is raised to the top position of its vertical stroke. That is, the fitting engagement permits the heat insulating cylinder to vertically telescope to thereby freely change a degree of heat insulation for a crystal.

In the present embodiment, only the intermediate heat insulating cylinder 12 is vertically movable. However, as shown in FIG. 1D, in addition to the intermediate heat insulating cylinder 12, the top heat insulating cylinder 11 may be made vertically movable in a manner independent of the intermediate heat insulating cylinder 12.

As a result of allowing a plurality of heat insulating cylinders to be vertically movable in a manner independent of each other, degrees of freedom improve drastically, so that a temperature distribution within a furnace can be changed or controlled more freely to thereby more freely change or control the thermal history of a crystal, as compared with a case where only one heat insulating cylinder is vertically movable or where heat insulating cylinders are movable but cannot move independently of each other.

Support shafts 10a for supporting the intermediate heat insulating cylinders 12 and support shafts 10b for supporting the top heat insulating cylinder 11 may be readily installed through installation at mutually different diagonal positions with respect to the center axis of the chamber 1.

Where to divide the heat insulating cylinder and the number of divisions are important and may be selected in accordance with a temperature range subjected to adjustment. For example, the above-described heat insulating cylinder is divided into three vertical divisions. However, the heat insulating cylinder may be divided into two as shown in FIG. 1A or into more than three. When the heat insulating cylinder is divided into vertically movable divisions in order to control the thermal history of a crystal being grown by the CZ method, the heat insulating cylinder is divided at positions located above the surface of a melt of material contained in a crucible, so that the effect of the division acts more directly on a crystal being grown. However, positions of division are not limited thereto. The heat insulating cylinder may be divided at a variety of positions and into an adequate number of divisions in order to change or control an intra-furnace temperature distribution, which has an effect on the efficiency of manufacture of crystals.

The heat insulating cylinder may be made of conventional carbon fiber forms or any other heat insulating materials. Conventionally, the heat insulating cylinder is integrally made of a single kind of material and is manufactured to have a uniform thickness. However, in the present invention, the vertical divisions of the heat insulating cylinder may be made of different materials and may have different thicknesses. This arrangement provides the vertical divisions of the heat insulating cylinder with a wider range of heat insulating capabilities, thereby allowing a user to finely adjust the heat insulating capability of the entire heat insulating cylinder. Accordingly, it becomes possible to finely and accurately control a temperature distribution within a furnace to thereby control the thermal history of a crystal accordingly.

The heat insulating cylinder of the present invention is made of a fibrous material such as carbon fiber forms, which are used as material for conventional heat insulating cylinders. Such a fibrous material is easy to process, and thus the heat insulating cylinder can be readily manufactured. A vertical movement of a heat insulating cylinder may cause fibers to exfoliate due to its surface being rubbed. However, through employment of an inner graphite cylinder 9, such exfoliations can be prevented from having an adverse effect on the pulling of a crystal.

A crystal manufacturing apparatus of the present invention using a heat insulating cylinder having the above-described structure allows a user to finely control a temperature distribution within a furnace, so that the thermal history of a crystal being grown can be finely controlled. Accordingly, the apparatus of the present invention is applicable to the growth of various crystals, which are generally grown by the CZ method. The apparatus of the invention is particularly useful for the growth of a crystal of silicon, in which the thermal history of a crystal has a great effect on OSF, oxygen precipitation, BMD, FPD, LSTD, and the oxide dielectric breakdown voltage, and for the growth of crystals of compound semiconductors such as GaP, GaAs, and InP, in which the thermal history of a crystal has a great effect on dislocation density and a level of defects as functioning as a donor or an acceptor.

Next will be described a method of the present invention for pulling a crystal through use of the above-described apparatus of the present invention.

When two or more crystals are pulled within a single batch as in the aforementioned multi-pulling method, a vertically movable heat insulating cylinder is vertically moved to change its position between crystals to thereby grow crystals under different thermal histories.

Figure 2A:
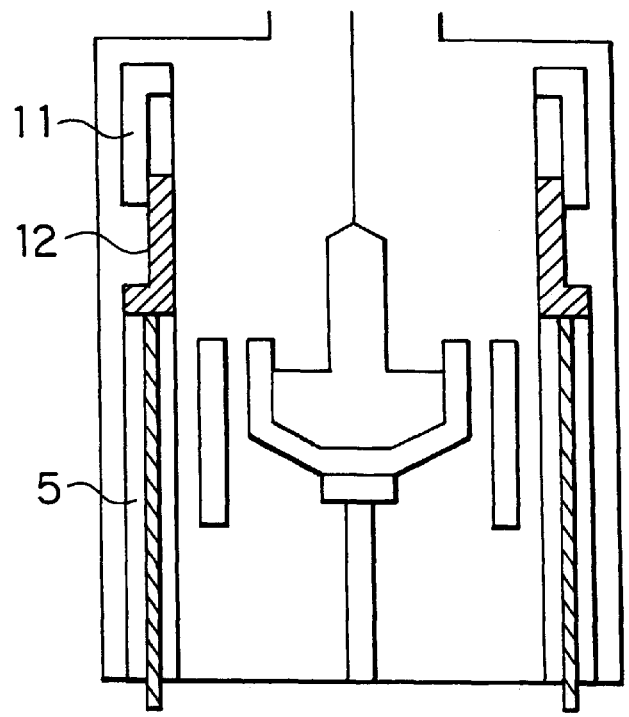
FIG. 2A is a schematic sectional view of the crystal manufacturing apparatus of FIG. 1B, illustrating a change of the thermal history of a crystal through movement of the intermediate division of the heat insulating cylinder to a bottom position of its vertical stroke.
Figure 2B:
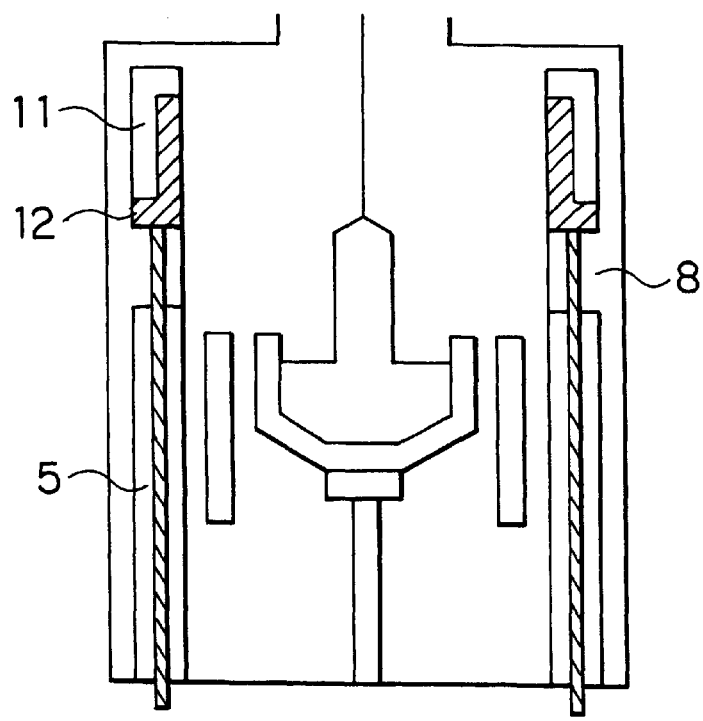
FIG. 2B is a schematic sectional view of the crystal manufacturing apparatus of FIG. 1B, illustrating a change of the thermal history of a crystal through movement of the intermediate division of the heat insulating cylinder to a top position of its vertical stroke.

Referring to FIGS. 2A and 2B, a change of density of FPD and COP through control of an intra-furnace temperature distribution in a temperature range of 1000° C. or higher will be described. The gap 8 to be formed between the heat insulating cylinder 5 and the intermediate heat insulating cylinder 12 plays an important role in controlling an intra-furnace temperature distribution in this temperature range. When the intermediate heat insulating cylinder 12 is positioned at the bottom point of its vertical stroke as shown in FIG. 2A, the gap 8 becomes 0 cm, and thus a crystal is heat-insulated and cooled gradually in the temperature range of 1000° C. or higher.

On the other hand, when the intermediate heat insulating cylinder 12 is positioned at the top point of its vertical stroke as shown in FIG. 2B, a crystal is cooled quickly in the temperature range of 1000° C. or higher. Accordingly, when the gap 8 is 0 cm, a crystal having a low density of FPD is obtained. When the gap 8 is widened, a crystal having a low density of COP is obtained.

As described above, this method allows crystals to be grown under different thermal histories through a change of the position of a heat insulating cylinder. Accordingly, in contrast with a conventional method wherein only crystals having a similar tendency of quality can be grown within a single batch, this method permits a thermal history to be changed between crystals within a single batch in accordance with a required quality or a standard. Also, in this method, crystals having a required quality can be grown in any required quantity.

This method, however, cannot provide a crystal which meets quality requirements for both FPD and COP or for other defects.

To solve this problem, in contrast with a conventional method wherein a heat insulating cylinder is normally made stationary while a crystal is being pulled, the present invention provides a method wherein a heat insulating cylinder is vertically moved while a crystal is being pulled, to thereby freely control a temperature distribution within a furnace so as to attain the thermal history of a crystal which cannot be attained by a conventional method.

Accordingly, when a long crystal is pulled, it can consist of portions having different qualities, for example, in the following manner: the intermediate heat insulating cylinder 12 is positioned as shown in FIG. 2A for the first half of the crystal so as to control the FPD density to a low level by heat-insulating the pulling crystal, and then the intermediate heat insulating cylinder 12 is gradually raised as the crystal grows, so that heat is horizontally released through the gap 8 so as to quickly cool the last half of the crystal which would otherwise be difficult to cool, thus controlling the COP density to a low level for the last half of the crystal.

In this manner, it becomes possible to grow a crystal which meets a plurality of quality requirements, with no requirement to drastically lower a crystal growth rate.

As a result of dividing the heat insulating cylinder into vertical divisions and vertically moving a vertical division of the heat insulating cylinder while a crystal is being pulled, it becomes possible to highly precisely control the thermal history of a crystal over a wider temperature range.

In the present invention, when a vertical division of the heat insulating cylinder is moved vertically while a crystal is being pulled, the speed of vertically moving the vertical division of the heat insulating cylinder is linked with the pulling rate of a crystal.

As a result of linking the speed of vertically moving the vertical division of the heat insulating cylinder with the pulling rate of a crystal, the vertical division of the heat insulating cylinder can be moved precisely to a desired position as a crystal grows, so that the thermal history of a crystal can be extremely precisely controlled and adjusted to a desired thermal history.

Since the method of the present invention can precisely control the thermal history of a crystal being grown by the CZ method, this method is particularly useful for growing crystals of silicon, germanium, GaP, GaAs, and InP with which a thermal history during growth has a great effect on the generation of crystal defects. The thus-grown crystals of silicon, germanium, GaP, GaAs, and InP feature a quite high quality and a precisely controlled crystal defect density which are attained through precise control of the thermal history during crystal growth.

EXAMPLES

Examples of the present invention will now be described in comparison with Comparative Examples.

Figure 3:
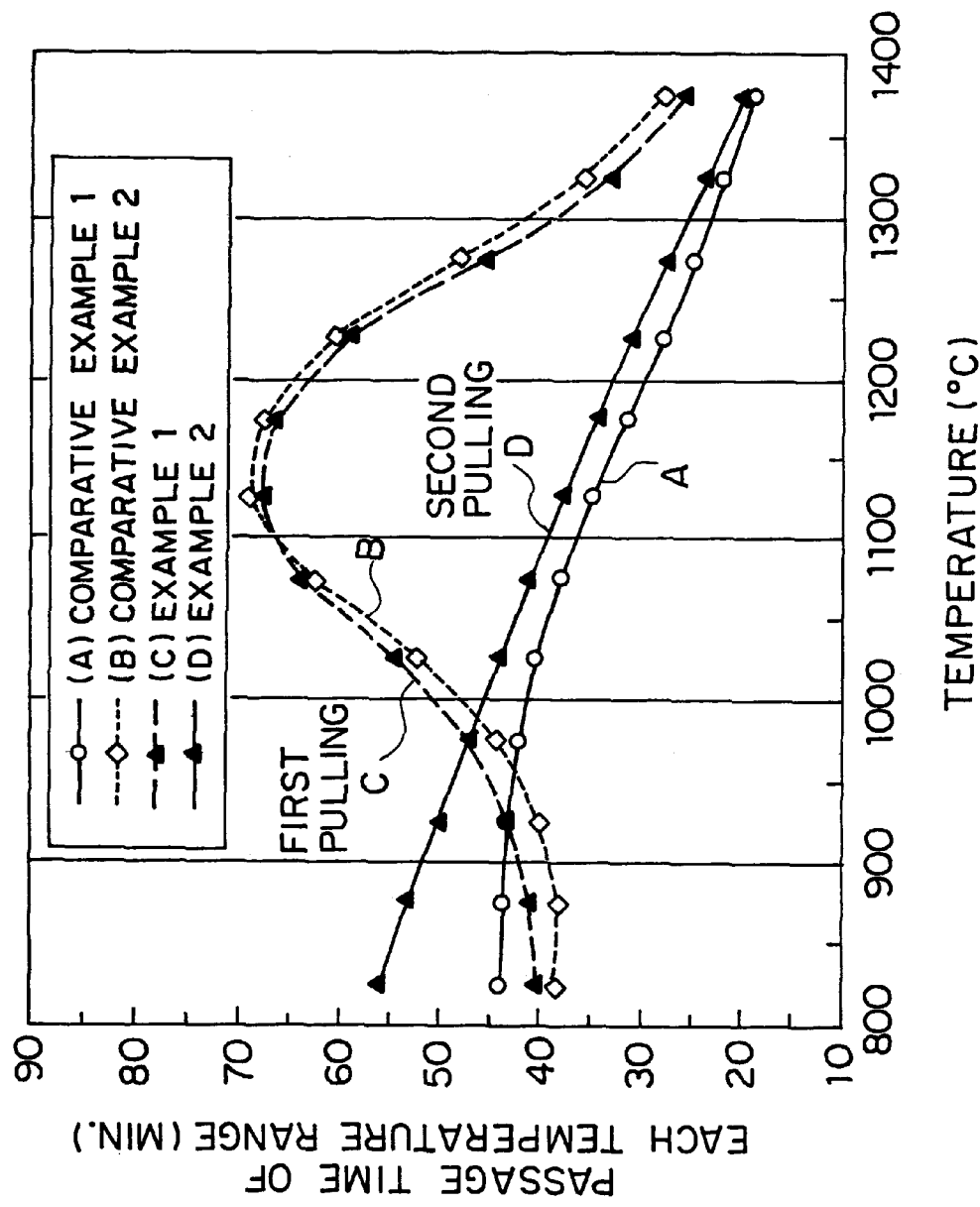
FIG. 3 is a graph plotting measured thermal histories for Examples and Comparative Examples.

60 kg of polysilicon material was charged into a quartz crucible having a diameter of 18 inches, and a single crystal of silicon having a diameter of 6 inches and a <100> orientation was pulled. The thermal history of a crystal was measured and compared between a crystal manufacturing apparatus using a conventional heat insulating cylinder and a crystal manufacturing apparatus using a heat insulating cylinder of the present invention. A carbon heater (resistance heating) was used. FIG. 3 shows the result of measurement on the thermal history of a crystal. In FIG. 3, the vertical axis indicates the passage time of each temperature range, while the horizontal axis indicates temperatures.

Comparative Examples

Crystals were pulled in conventional crystal manufacturing apparatuses having fast-cooling and slow-cooling furnace structures as shown in FIGS. 4A and 4B. A heat insulating cylinder was integrally made of carbon fiber forms and had thickness of 7 cm. The result of measurement on the thermal history of a crystal is represented by curves A (fast cooling type) and B (slow cooling type) in FIG. 3.

Example 1

A crystal was pulled in the crystal manufacturing apparatus as shown in FIG. 2A. The vertically movable intermediate heat insulating cylinder 12 was positioned at the bottom point of its vertical stroke while a crystal was pulled. The result of measurement on the thermal history of the crystal is represented by curve C in FIG. 3.

As seen from FIG. 3, curve C is similar to curve B. That is, the pulled crystal has quality similar to that of a crystal pulled in the conventional slow-cooling type crystal manufacturing apparatus as shown in FIG. 4B.

Example 2

The crucible was re-charged with the material to contain again 60 kg of the material. The vertically movable intermediate heat insulating cylinder 12 was positioned at the top point of its vertical stroke as shown in FIG. 2B, to thereby form the gap 8. Apparatus conditions other than the position of the intermediate heat insulating cylinder 12 were similar to those of Example 1. In this state, a crystal was pulled. The result of measurement on the thermal history of the crystal is represented by curve D in FIG. 3.

As seen from FIG. 3, curve D is similar to curve A. That is, the pulled crystal has quality similar to that of a crystal pulled in the conventional fast-cooling type crystal manufacturing apparatus as shown in FIG. 4A.

Thus, when in the crystal manufacturing apparatus shown in FIG. 2, a plurality of crystals are pulled within a single batch, the thermal history of a crystal being grown can be made different between crystals in the batch.

Also, it is seen from FIG. 3 that through a change of the position of the intermediate heat insulating cylinder 12, a temperature distribution within a furnace can be freely varied to thereby obtain crystals whose thermal histories range between curve D and curve C. Further, in the Examples, the intermediate heat insulating cylinder 12 was held stationary while a crystal was being pulled. However, by vertically moving the intermediate heat insulating cylinder 12 while a crystal is being pulled, any portion of the crystal can be subjected to any thermal history ranging from curve D to curve C of FIG. 3.

The present invention is not limited to the above-described embodiments and examples. The embodiments and examples are to be considered as illustrative and not restrictive. Numerous modifications and variations of the present invention are possible in light of the spirit of the present invention, and they are not excluded from the scope of the present invention.

What is claimed is:

1. A crystal manufacturing apparatus for manufacturing crystals according to the Czochralski method, comprising:
    a crucible for containing a material;
    a heater for heating and melting the material in said crucible to form a melt; and
    a heat insulating cylinder surrounding said crucible and said heater, said heat insulating cylinder including at least two vertical divisions which are vertically separable from each other at a position above a surface of the melt, and at least one of the at least two vertical divisions is vertically movable.

2. A crystal manufacturing apparatus according to claim 1, wherein at least two of the at least two vertical divisions of said heat insulating cylinder are vertically movable independently of each other.

3. A crystal manufacturing apparatus according to claim 2, further comprising at least one support shaft, each support shaft supporting and vertically moving one of the at least two vertical divisions of said heat insulating cylinder when inserted from under a chamber, and each support shaft is movable through a hole formed in a stationary vertical division of said heat insulating cylinder.

4. A crystal manufacturing apparatus according to claim 3, wherein the at least two vertical divisions of said heat insulating cylinder have different thicknesses.

5. A crystal manufacturing apparatus according to claim 1, wherein the at least two vertical divisions of said heat insulating cylinder include portions which fittingly engage each other.

6. A crystal manufacturing apparatus according to claim 1, further comprising at least one support shaft, each support shaft supporting and vertically moving one of the at least two vertical divisions of said heat insulating cylinder when inserted from under a chamber, and each support shaft being movable through a hole formed in a stationary vertical division of said heat insulating cylinder.

7. A crystal manufacturing apparatus according to claim 6, wherein the at least two vertical divisions of said heat insulating cylinder have different thicknesses.

8. A crystal manufacturing apparatus according to claim 1, wherein the at least two vertical divisions of said heat insulating cylinder have different thicknesses.

9. A crystal manufacturing apparatus according to claim 1, wherein the at least two vertical divisions of said heat insulating cylinder comprise different materials.

10. A crystal manufacturing apparatus according to claim 1, wherein said heat insulating cylinder comprises carbon fiber.

11. A method of manufacturing a crystal in accordance with the Czochralski method, comprising:
    providing the crystal manufacturing apparatus of claim 1;
    melting the material in said crucible to form the melt;
    vertically separating the at least two vertical divisions at a position above a surface of the melt; and
    manufacturing a crystal using the apparatus by the Czochralski method.

12. A method of manufacturing a crystal in accordance with the Czochralski method, comprising:

providing the crystal manufacturing apparatus of claim 1;

melting a material selected from the group consisting of silicon, germanium, GaP, GaAs and InP in said crucible to form the melt;

vertically separating the at least two vertical divisions at a position above a surface of the melt; and manufacturing a crystal of the material using the apparatus by the Czochralski method.

13. A method of controlling a temperature distribution within a crystal manufacturing apparatus that is operated in accordance with the Czochralski method, comprising:

providing the crystal manufacturing apparatus of claim 1;

melting the material in said crucible to form the melt;

manufacturing a crystal of the material using the apparatus operated in accordance with the Czochralski method; and controlling the temperature distribution within the apparatus above a surface of the melt during the manufacturing of the crystal.

14. A method of controlling a thermal history of a crystal comprising:

providing the crystal manufacturing apparatus of claim 1; and melting the material in said crucible to form the melt;

manufacturing a crystal of the material using the apparatus in accordance with the Czochralski method; and controlling the thermal history of the crystal within the apparatus during the manufacturing of the crystal.

15. A method of manufacturing a crystal in accordance with the Czochralski method, comprising:

providing the crystal manufacturing apparatus of claim 1;

melting the material in said crucible to form the melt;

pulling at least two crystals within a single batch; and simultaneously vertically moving at least one of the at least two vertical divisions between growth operations of the crystals so as to change the position of the at least one of the at least two vertical divisions above a surface of the melt, so that the at least two crystals have different thermal histories.

16. A method of manufacturing a crystal according to claim 15, wherein the material is selected from the group consisting of silicon, germanium, GaP, GaAs and InP.

17. A method of manufacturing a crystal in accordance with the Czochralski method, comprising:

providing the crystal manufacturing apparatus of claim 1;

melting the material in said crucible to form the melt;

vertically moving at least one of the at least two vertical divisions of said heat insulating cylinder while pulling a crystal; and controlling (i) the temperature distribution within the apparatus, and (ii) the thermal history of the crystal within the apparatus, during the manufacturing of the crystal.

18. A method of manufacturing a crystal according to claim 17, wherein the material is selected from the group consisting of silicon, germanium, GaP, GaAs and InP.

19. A method of manufacturing a crystal in accordance with the Czochralski method, comprising:

providing the crystal manufacturing apparatus of claim 1;

melting the material in said crucible to form the melt; and moving at least one of the at least two vertical divisions of the heat insulating cylinder vertically above a surface of the melt while pulling a crystal.

20. A method of manufacturing a crystal in accordance with the Czochralski method, comprising:

providing the crystal manufacturing apparatus of claim 1;

melting the material in said crucible to form the melt;

moving at least one of the at least two vertical divisions vertically above a surface of the melt while pulling a crystal; and linking the speed of vertically moving the at least one of the at least two vertical divisions with the pulling rate of said crystal.

* * * * *